United States Patent [19]

Morioka

[11] Patent Number: 5,768,643
[45] Date of Patent: Jun. 16, 1998

[54] METHOD OF PRODUCING PHOTOGRAPHIC RELIEF

[75] Inventor: Kimihiko Morioka, Tokyo, Japan

[73] Assignee: Rittaishashinzo Co., Ltd., Tokyo, Japan

[21] Appl. No.: 743,748

[22] Filed: Nov. 7, 1996

[30] Foreign Application Priority Data

Oct. 11, 1995 [JP] Japan ................... 7-292338

[51] Int. Cl.⁶ .................... G03B 35/00; G03B 41/00
[52] U.S. Cl. ........................... 396/325; 396/334
[58] Field of Search .................... 396/322, 333, 396/334, 325

[56] References Cited

U.S. PATENT DOCUMENTS

| | | |
|---|---|---|
| 3,185,602 | 5/1965 | Morioka . |
| 4,063,265 | 12/1977 | Lo et al. . |
| 4,239,359 | 12/1980 | Morioka ................... 396/325 |
| 4,931,817 | 6/1990 | Morioka ................... 396/325 |
| 5,040,005 | 8/1991 | Davidson et al. ................... 396/325 |

FOREIGN PATENT DOCUMENTS

| | | |
|---|---|---|
| 0 314 608 A2 | 5/1989 | European Pat. Off. . |
| 47-27734 | 7/1972 | Japan . |
| 47-49613 | 12/1972 | Japan . |
| 49-7494 | 2/1974 | Japan . |
| 56-18936 | 5/1981 | Japan . |
| 59-46374 | 11/1984 | Japan . |
| 4-47295 | 8/1992 | Japan . |

*Primary Examiner*—David M. Gray
*Attorney, Agent, or Firm*—McGlew and Tuttle

[57] ABSTRACT

It is an object of the present invention to easily produce a relief of a model viewed from the most preferable angle without pain to the model. In order to achieve this object, 1) a process of producing a stereophotographic sculpture is performed to produce a three-dimensional unadjusted sculpture 1, 2) the angle at which the individuality of the model is best represented is determined based on the sculpture, 3) the unadjusted sculpture 1 is photographed at that angle and, 4) a relief 14 is produced based on the pictures thus obtained.

5 Claims, 13 Drawing Sheets

FIG.7(a)
FIG.7(b)
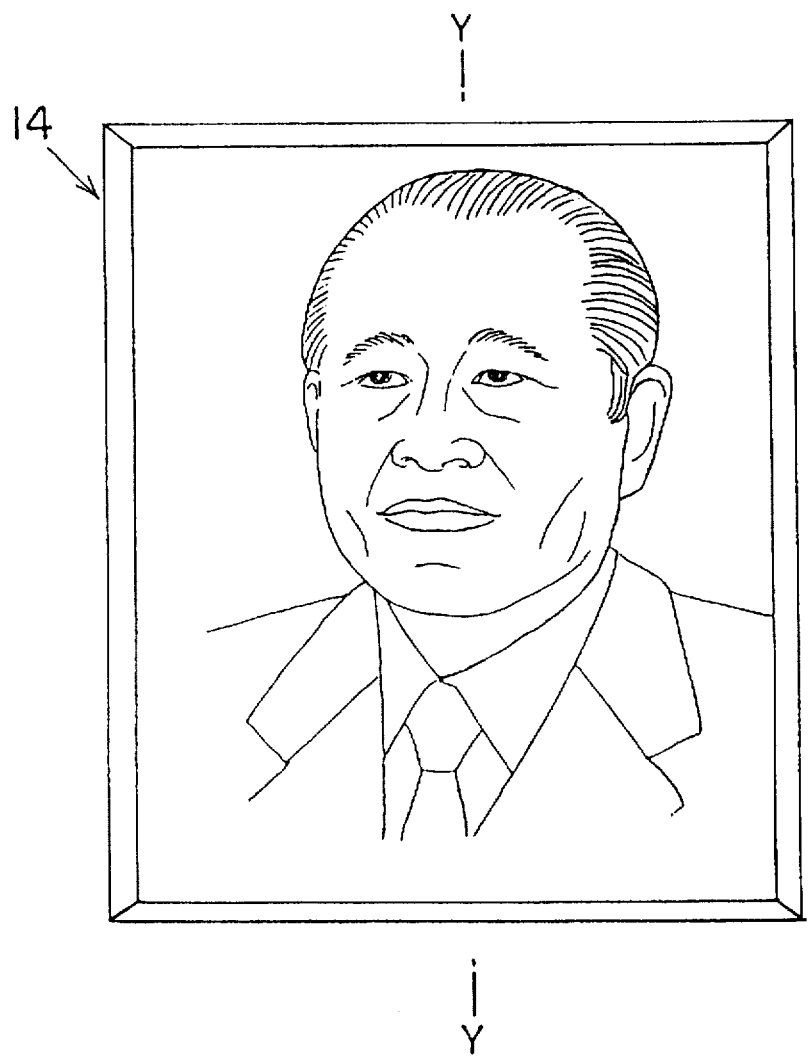
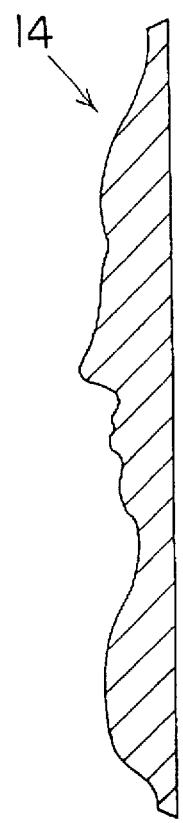

F I G .12
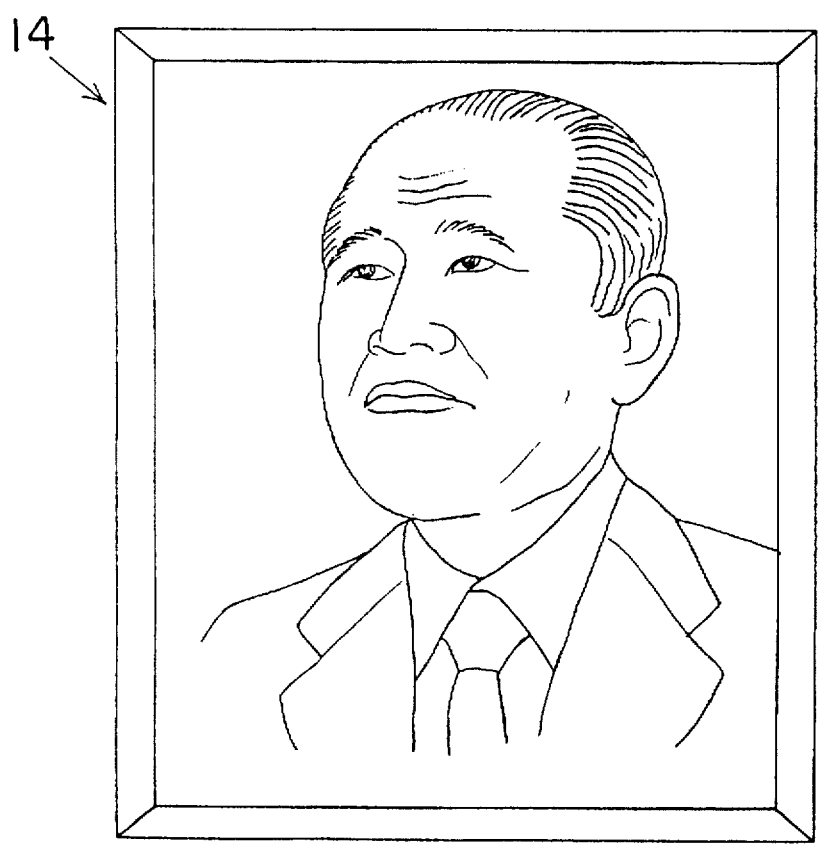

METHOD OF PRODUCING PHOTOGRAPHIC RELIEF

BACKGROUND OF THE INVENTION AND RELATED ART STATEMENT

The present invention relates to a method of producing a photographic relief.

Regarding the production of a stereophotographic sculpture or a relief work (hereinafter referred to as "relief") of a human model (hereinafter referred to as "model"), methods have been proposed wherein a sculpture is produced based on pictures taken of a model. Methods for producing a stereophotographic sculpture include those disclosed in Japanese Patent Publication Nos. 59-46374(1984), 4-47295 (1992), and 47-49613(1972), and methods for producing a photographic relief include those disclosed in Japanese Patent Publication Nos. 49-7494(1974), 47-27734(1972), and 56-18936(1981).

In reality, the expression of a model continually moves and changes at every moment. A relief produced from photographs according to conventional methods can represent only limited aspects of the expression of a person at any given moment which is only a limited range of the expression that person can actually exhibit. It inevitably takes time to make a satisfactory decision to choose one aspect over all others of a face, and it is difficult to make such a decision directly from the face of a model during photographing.

It may be possible to photograph every expression of a model from various angles. However, this method is not preferable because it involves large amounts of time and expense and is particularly uncomfortable for the person modeling.

OBJECT AND SUMMARY OF THE INVENTION

The present invention has been conceived while taking the above-described situation into consideration, therefore it is an object of the present invention to provide a method of producing a photographic relief which makes it possible to easily produce a relief representing a model when viewed from the most preferable angle.

According to the present invention, a three-dimensional unadjusted stereoscopic sculpture is first produced based on a method of producing a stereophotographic sculpture. The angle at which the individuality of the model is best represented is chosen based on the stereoscopic sculpture. Then, the stereoscopic sculpture is photographed from that angle, and a relief is produced based on the pictures thus obtained.

In summary, the present invention is directed to a method of producing a photographic relief comprising the steps of disposing a plurality of first cameras and a plurality of first projectors, each being loaded with a screen having a plurality of parallel lines therein, around an object to be photographed at a predetermined object distance in order to take a first picture with each of the first cameras while projecting the screens from the first projectors onto the object to be photographed, disposing a plurality of second projectors at a predetermined operative distance for projection to a mass of material to be modeled such that they may be located in a similar position to that of each of the first cameras and each of the second projectors being loaded with each of the first pictures thereby projecting the first pictures onto the mass of material to be modeled which is then processed so that a plurality of parallel lines projected from the first pictures, on the mass of material to be modeled, are overlapped with each other to produce an unadjusted sculpture similar to the photographed object, placing said unadjusted sculpture on a base which can be tilted at a desired angle as a second object to take a second photographic pictures in the most preferable attitude, and producing an unadjusted relief, using said second photographic pictures, and finishing said unadjusted relief to produce a relief.

BRIEF DESCRIPTION OF THE DRAWINGS

FIG. 7(a) is a frontal view showing a relief of a model who looks slightly to the right, produced using the method of producing a photographic relief according to the present invention.

FIG. 7(b) is a sectional view taken along the line Y—Y in FIG. 7(a).

FIG. 12 is a frontal view showing a relief of a model who looks slightly to the right and upward, produced using the method of producing a photographic relief according to the present invention.

DETAILED DESCRIPTION OF PREFERRED EMBODIMENT

An embodiment of the method of producing a photographic relief according to the present invention will now be described in detail with reference to the accompanying drawings.

The method of the present embodiment comprises a stereophotographic sculpture producing step for producing an unadjusted sculpture 1 which is a three-dimensional stereoscopic sculpture using a method of producing a stereophotographic sculpture and a photographic relief producing step for producing a relief, using the unadjusted sculpture 1 at an arbitrary attitude, as a second object to be photographed, by placing the unadjusted sculpture 1 on a table 3 with base 2 which can be tilted at any angle.

Figure 1:
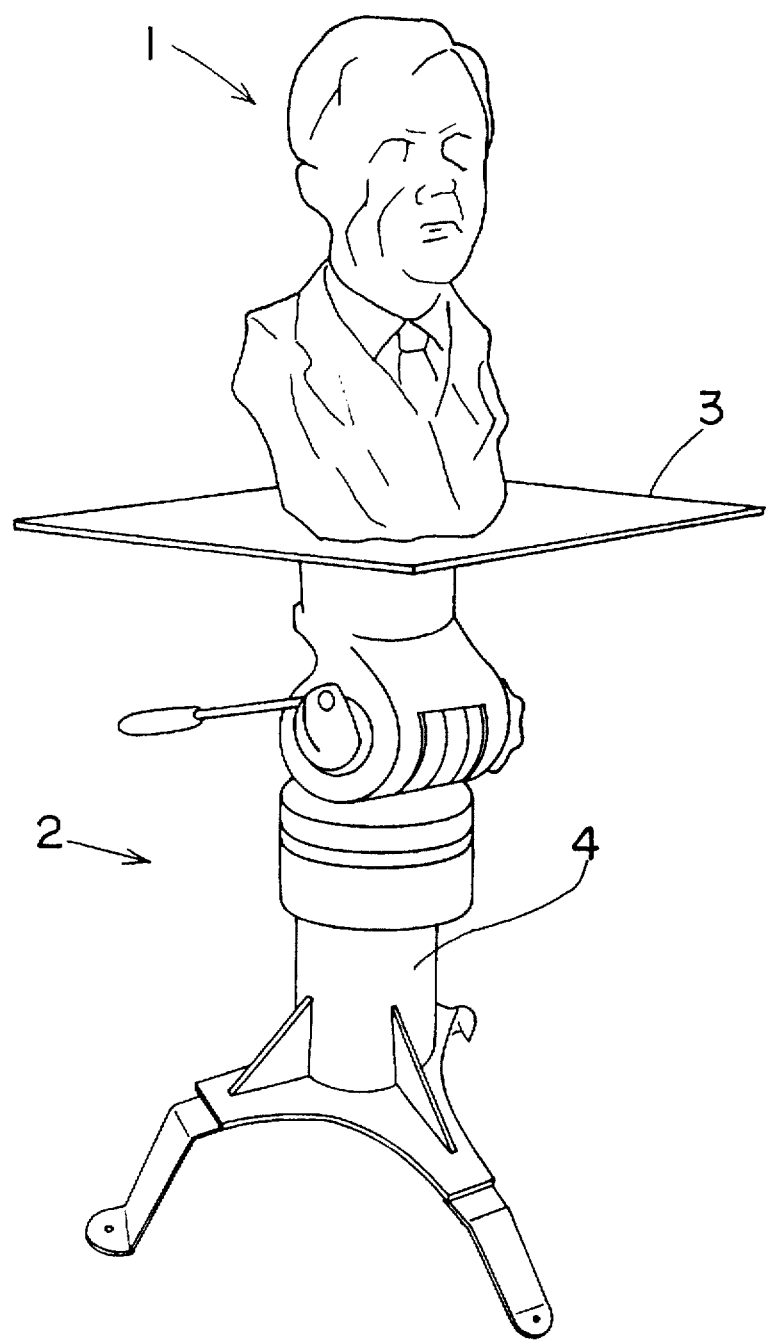
FIG. 1 is a perspective view of a base for placing an unadjusted sculpture employed in an embodiment of a method of producing a photographic relief according to the present invention.

As shown in FIG. 1, the base 2 for placing the unadjusted sculpture 1 is a so-called universal base having a configuration wherein the table 3 is supported on a leg 4 so that it can be tilted up and down and back and forth. The unadjusted sculpture 1 is placed on the base 2 and is kept moving arbitrarily to find the angle at which the individuality of the model is best represented, as exemplefied by FIGS. 7(a)–14. When such an angle is determined, the unadjusted sculpture 1 is photographed at that attitude.

The unadjusted sculpture 1 is a sculpture which has been formed to a degree that allows the individuality of the model to be seen on it (for example, a sculpture which has been formed to show its face clearly). The time required to produce unadjusted sculpture 1 takes only 10 to 15% of the time required, ordinarily, for all the steps required for the completion of a stereophotographic sculpture.

Next, each of the steps of producing a stereophotographic sculpture and a photographic relief will be described.

First, the step of producing a stereophotographic sculpture will be described with reference to FIGS. 2 through 5.

The step of producing a stereophotographic sculpture is comprised of a photographing step and a step of producing a stereophotographic sculpture.

Figure 2:
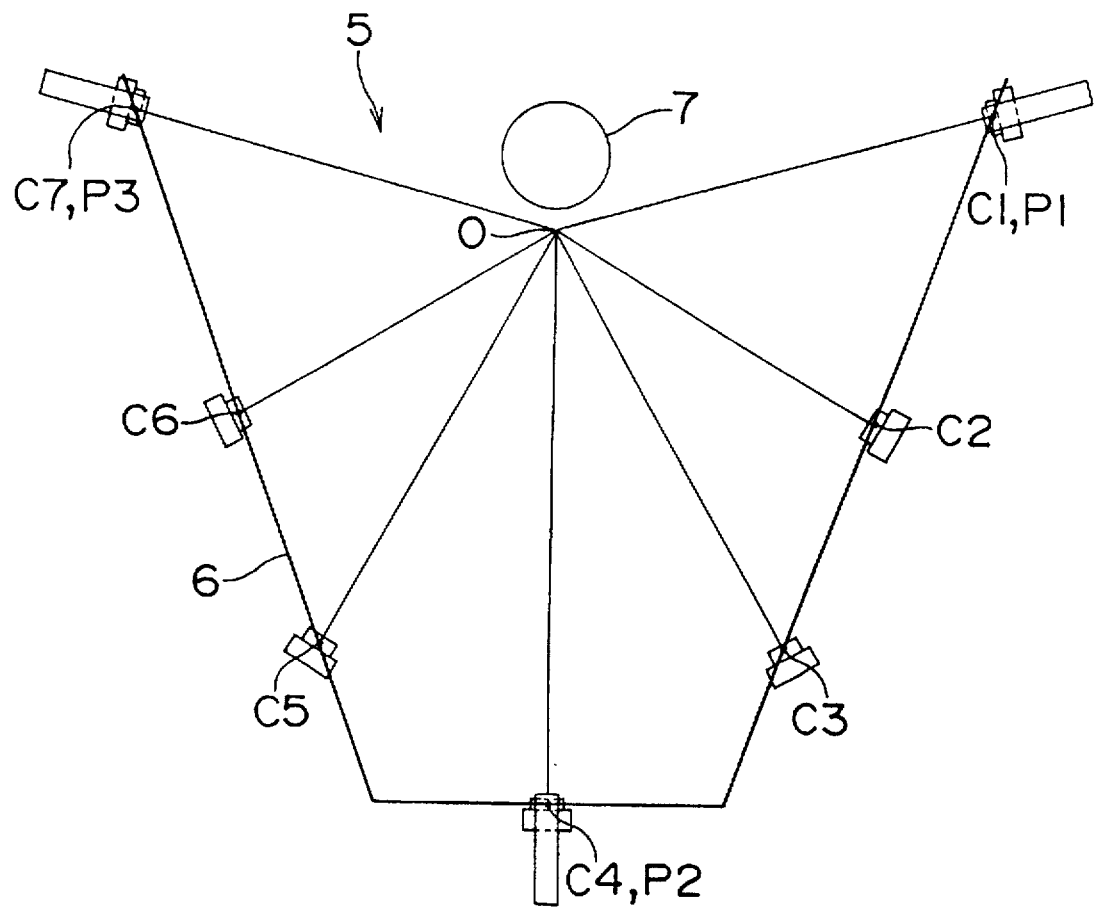
FIG. 2 is a conceptual view showing cameras used in a photographing step of a method of producing a stereophotographic sculpture employed in an embodiment of the present invention.

At the photographing step, for example, photographic apparatus 5 as shown in FIG. 2 is used.

The photographic apparatus 5 is comprised of seven cameras $C_1$, $C_2$, $C_3$, $C_4$, $C_5$, $C_6$, and $C_7$ and three projectors $P_1$, $P_2$, and $P_3$ disposed on a symmetrical nearly letter C-shaped frame 6. The reference characters $C_1$ through $C_7$ and $P_1$ through $P_3$ not only represent a group of cameras and a group of projectors, respectively, but also represent the optical lenses belonging to these components.

The camera $C_4$ is disposed in the center portion of the frame 2, and the cameras $C_3$, $C_2$, $C_1$ and $C_5$, $C_6$, $C_7$ are disposed on the frame 6 in a symmetrical relationship. The projectors $P_1$, $P_2$ and $P_3$ are disposed in the neighborhood of the cameras $C_1$, $C_4$ and $C_7$, respectively. A person is disposed as an object 7 in the open mouth area of the frame 2. A sphere is shown in the drawing for convenience in the description.

The cameras $C_1$ through $C_7$ and the projectors $P_1$ through $P_3$ are directed toward a point 0 which is slightly before the object 7.

Figure 3:
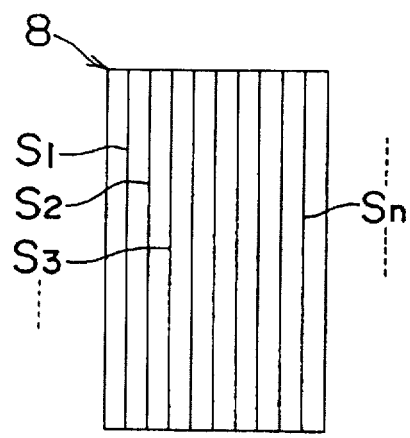
FIG. 3 is a conceptual view showing a screen used in the photographing step of the method of producing a stereophotographic sculpture employed in an embodiment of the present invention.
Figure 4:
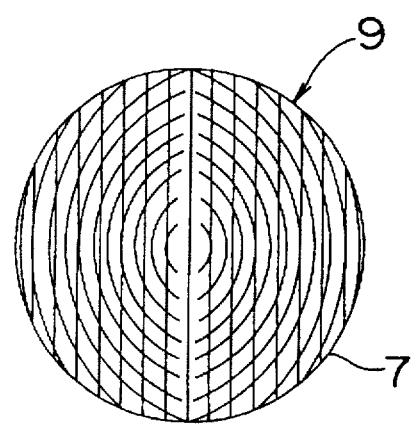
FIG. 4 is a view showing a pattern which appears on the surface of an object to be modeled during the method of producing a stereophotographic sculpture employed in an embodiment of the present invention.

Each of the projectors $P_1$ through $P_3$ is fitted with a screen 8 with a plurality of lines $S_1$ through $S_n$ running vertically in parallel as shown in FIG. 3, and the projectors projects the screens 8 onto the object 7. As a result, a pattern 9 as shown in FIG. 4 is projected on the surface of the object 7. The object 7 in this state is photographed by the cameras $C_1$ through $C_7$ to obtain negative and/or positive photographic pictures (hereinafter, referred to as "pictures" for convenience in the description).

Then, the stereoscopic sculpture producing step is started.

Figure 5:
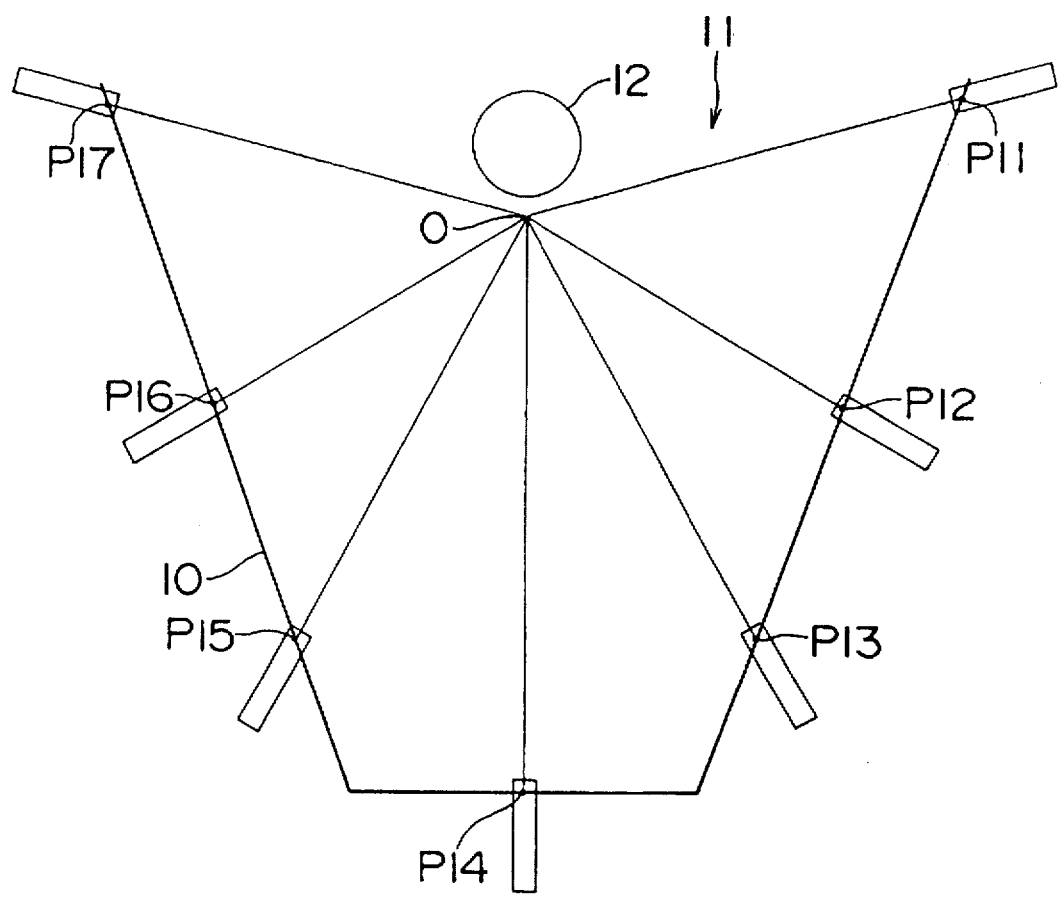
FIG. 5 is a conceptual view showing a stereoscopic sculpture producing apparatus used during the method of producing a stereophotographic sculpture employed in an embodiment of the present invention.

In the stereoscopic sculpture producing step, as shown in FIG. 5, an apparatus 11 is employed which produces a stereoscopic sculpture and comprises projectors $P_{11}$ through $P_{17}$, corresponding in quantity to the cameras $C_1$ through $C_7$ which replace them and are disposed in the corresponding locations on frame 10. Next, the object 7 is replaced on the same location with a mass of material 12, for example, a lump of clay, for the preparation of an original form for a stereophotographic sculpture.

The reference characters $P_{11}$ through $P_{17}$ not only represent the projectors, respectively, but also represent the optical lenses belonging thereto.

The projectors $P_{11}$ through $P_{17}$ are loaded with the pictures taken by the cameras $C_1$ through $C_7$ in the respective positions. These pictures contain the scenes of projection in the form of the pattern 9 which is a result of the deformation of the plurality of parallel lines $S_n$ of the screens 8, projected from the projectors $P_1$ through $P_3$, according to the surface configuration of object 7 at the photographing step (see FIG. 3).

When these pictures are projected onto the mass of material 12 from the projectors $P_{11}$ through $P_{17}$, a plurality of shadow stripes corresponding to the parallel lines $S_1$ through $S_n$ appear on the surface of the mass of material 12. Then, the mass of material is adjusted by removing or adding an appropriate amount of material in such a manner that each of the shadow stripes projected from each of the projectors overlap each other. When each of the stripes meet with each other on the mass of material 12, a representation of object 7 is obtained on the mass of material 12 of similar overall appearance characterized by the topographic features of object 7 (see FIG. 4).

This stereophotographic sculpture producing step provides a roughly formed unadjusted sculpture 1, i.e., an unadjusted sculpture which has been clearly formed only in the area of the face. The time required for producing the unadjusted sculpture 1 is only 10 to 15% of the time required for producing a completely adjusted sculpture.

Figure 6:
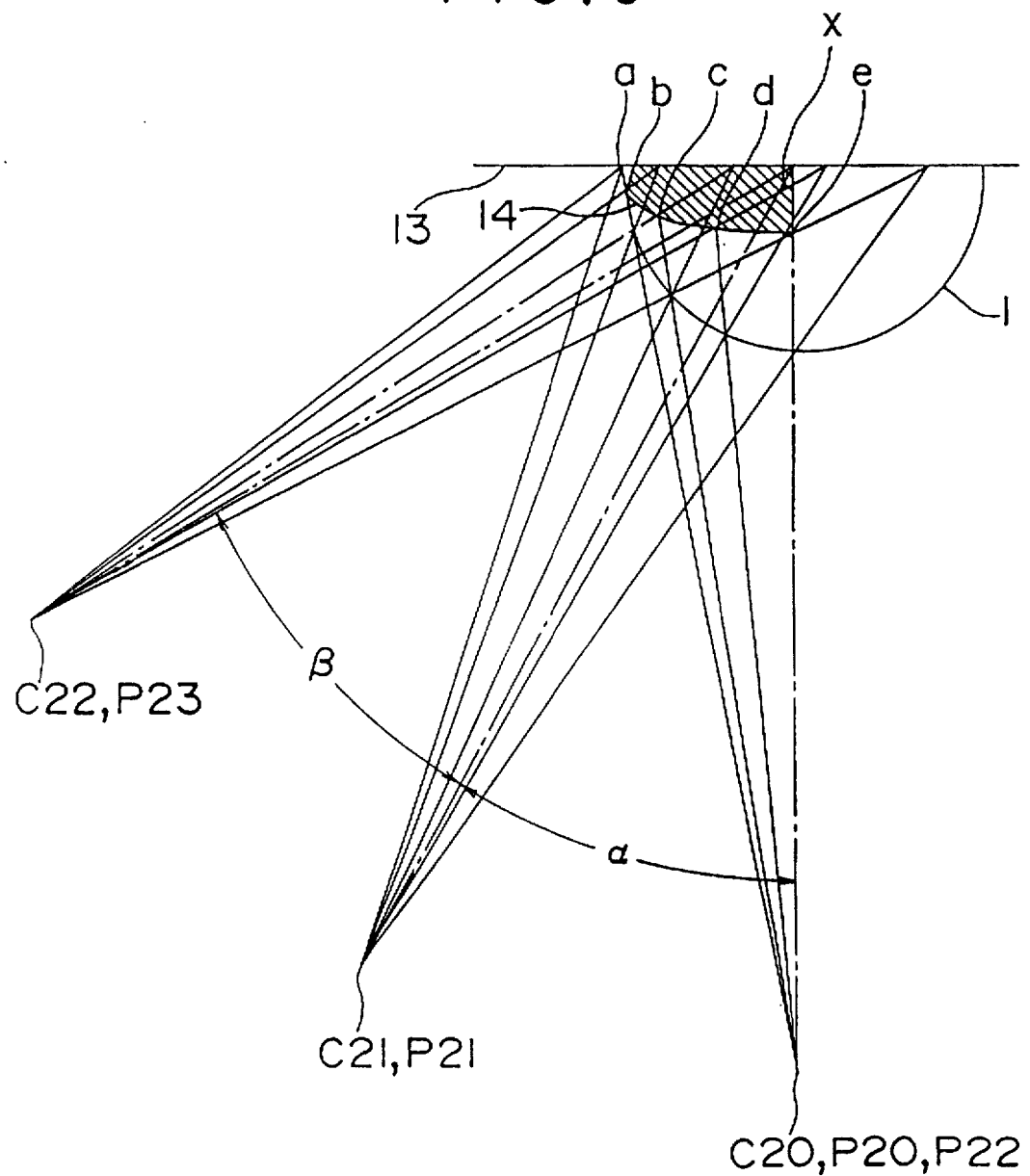
FIG. 6 is a view illustrating a step in the method of producing a photographic relief used in an embodiment of the present invention.
Figure 8:
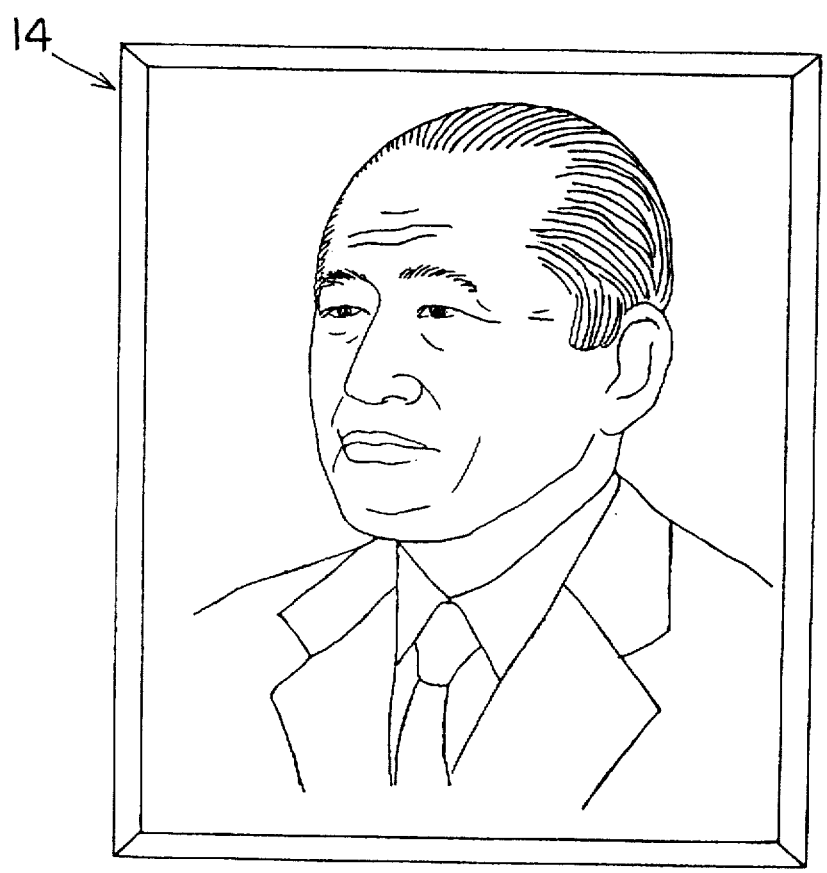
FIG. 8 is a frontal view showing a relief of the model who has turned further to the right from the attitude shown in FIG. 7, produced using the method of producing a photographic relief according to the present invention.
Figure 9:
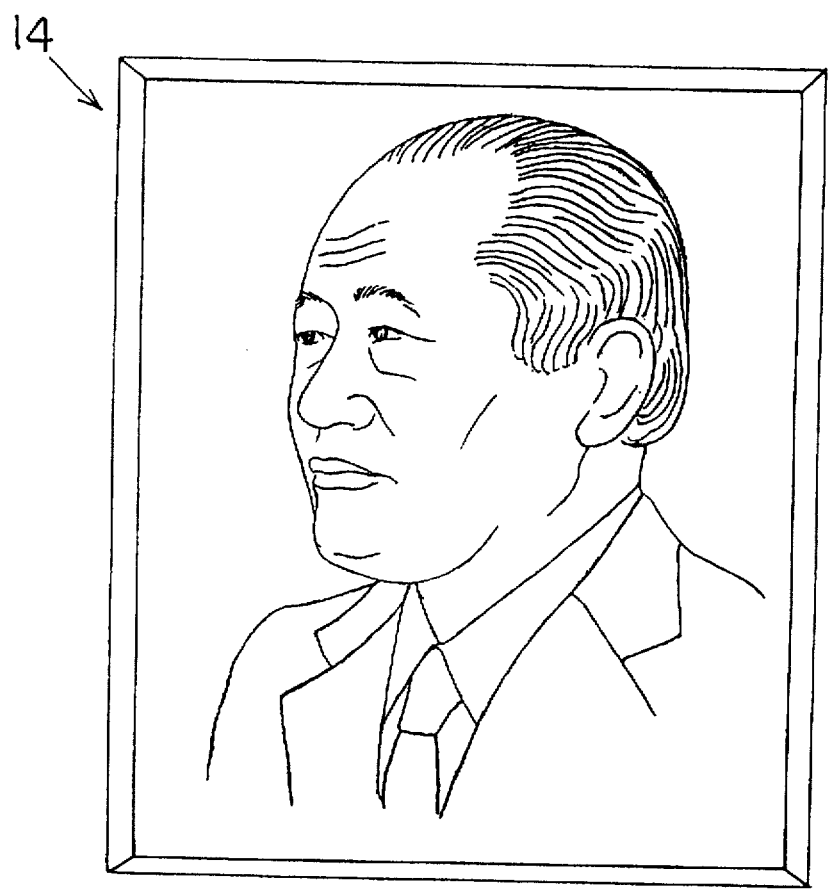
FIG. 9 is a frontal view showing a relief of the model who has turned further to the right from the attitude shown in FIG. 8, produced using the method of producing a photographic relief according to the present invention.
Figure 10:
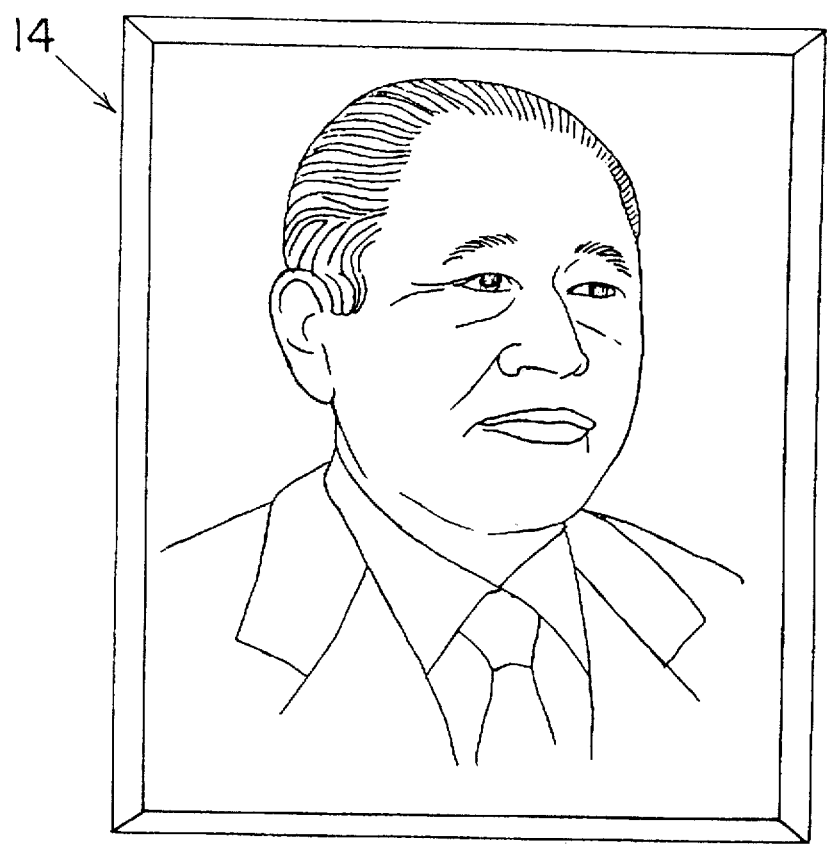
FIG. 10 is a frontal view showing a relief of a model who looks slightly to the left, produced using the method of producing a photographic relief according to the present invention.
Figure 11:
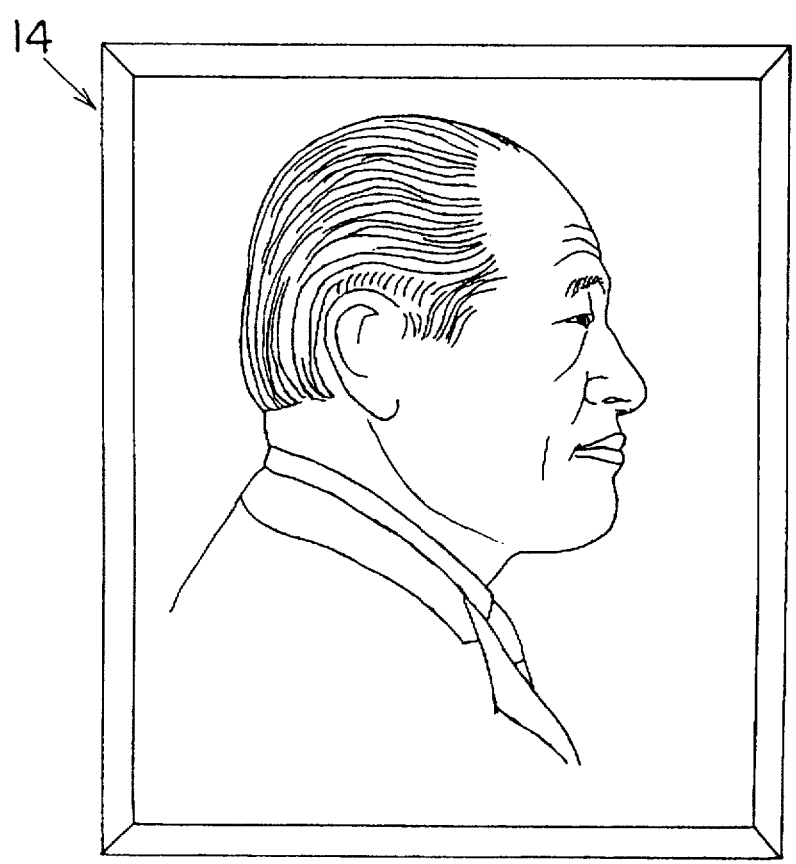
FIG. 11 is a frontal view showing a relief of a model as viewed from the right side, produced using the method of producing a photographic relief according to the present invention.
Figure 13:
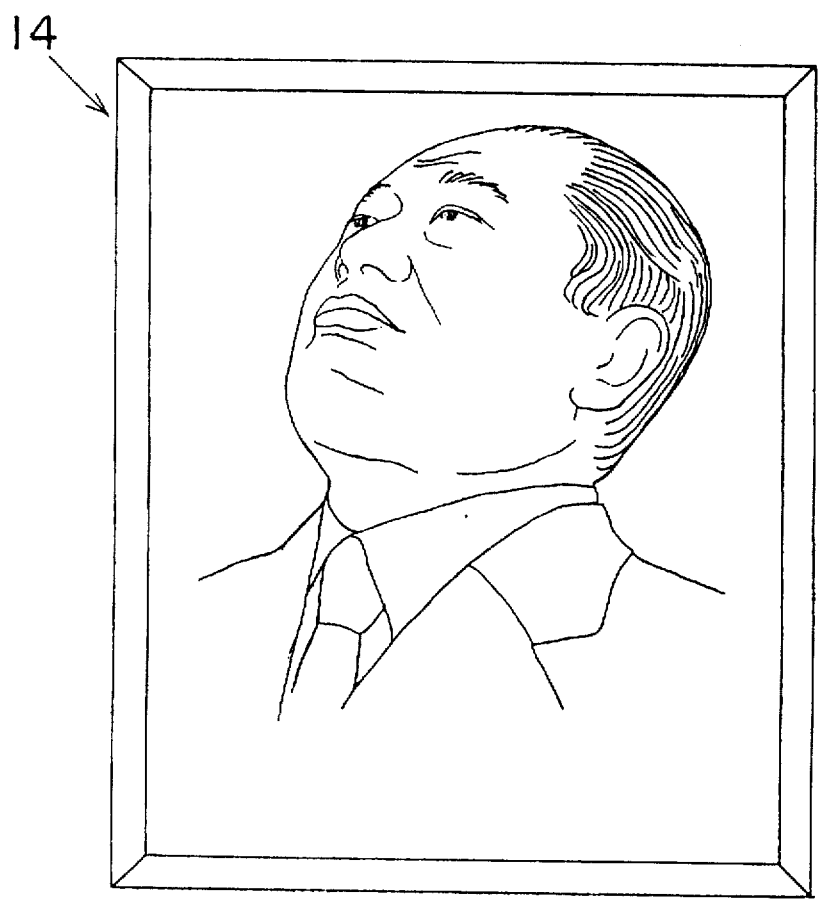
FIG. 13 is a frontal view showing a relief of the model who has turned further to the right and upward from the attitude in FIG. 12, produced using the method of producing a photographic relief according to the present invention.
Figure 14:
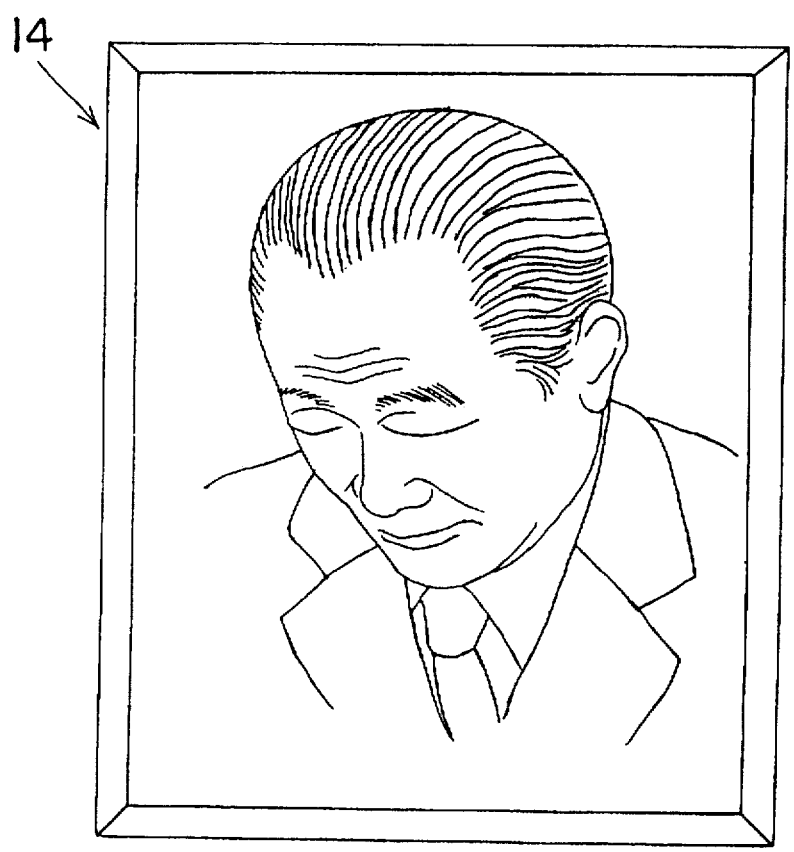
FIG. 14 is a frontal view showing a relief of a model who looks slightly to the right and downward, produced using the method of producing a photographic relief according to the present invention.

The photographic relief producing step will now be described with reference to FIG. 6.

The photographic relief producing step is comprised of a photographing step and a relief producing step.

First, in the photographing step, a camera $C_{20}$ and a projector $P_{20}$ loaded with a screen having a plurality of parallel lines therein (not shown) are disposed in front of the unadjusted sculpture 1 at an arbitrary distance, and a camera $C_{21}$ is disposed in a position displaced at an arbitrary angle α from a line connecting a vertical axis X of the unadjusted sculpture 1 and the camera $C_{20}$.

While the projector $P_{20}$ is projecting the screen onto the unadjusted sculpture 1, the cameras $C_{20}$ and $C_{21}$ photograph the unadjusted sculpture 1 to obtain a third picture and a fourth picture (not shown) of the same, respectively.

In the next relief producing step, a projector $P_{21}$ is disposed in the position of the camera $C_{21}$, and a camera $C_{22}$ is disposed in a position displaced at an arbitrary angle β from the line connecting the vertical axis X of the unadjusted sculpture 1 and the camera $C_{21}$. Next, the fourth picture is projected from the projector 1 onto a reference plane 13 which is orthogonal to a line connecting the vertical axis X of the unadjusted sculpture 1 and the camera $C_{20}$, and the image projected onto the reference plane 13 is photographed by the camera $C_{22}$ to obtain a fifth picture.

Thereafter, a projector $P_{22}$ (the function of which may be provided by the projector $P_{20}$) is disposed in the position of the camera $C_{20}$, and a projector $P_{23}$ is disposed in the position of the camera $C_{22}$ to project the third and fifth pictures onto the reference plane 13 from the projectors $P_{22}$ and $P_{23}$, respectively. Meanwhile, a lump of plastic material, e.g., clay, is stacked on the reference plane 13. The lump of clay is adjusted by adding or removing an appropriate amount of clay so that crossings a, b, c, d and e defined by the beams projected from the third and fifth pictures appear on the surface of the lump of clay to obtain a relief 14. Although FIG. 6 shows only the left half of the relief, the right half may be produced through photographing and projecting steps effected in a symmetrical manner relative to the left half to complete the relief. Above-described relief producing process is carried out by using method of Japanese Patent Publication No. 49-7494 (1974).

FIGS. 7 through 14 show various reliefs 14 produced at various angles according to the method of the present embodiment. Those reliefs are modeled upon an unadjusted three-dimensional stereoscopic sculpture produced through only one photographing operation. According to conventional methods of producing a relief, the model must be photographed eight times. This is not only uncomfortable for the model, but is also undesirable because the expression of the model changes. In the present embodiment, the model needs to be photographed only once, allowing multiple pictures from various angles to be taken of the unadjusted sculpture. This produces no pain for the model and makes it possible to easily produce a relief of the model as viewed from the most preferable angle.

Although the present embodiment employs a method for producing a relief of a model who is looking off-center, the present invention is not limited thereto and a method for producing a relief of a model who is looking directly forward may be employed. In the photographic relief producing method used in this case, a third projector loaded with a screen, having a plurality of lines running vertically in parallel, is disposed on the left or right side of the unadjusted sculpture 1, and a third camera is disposed on the same side as the third projector at a greater angle (see Japanese Patent Publication No. 56-18936(1981)).

As described above, according to the method of producing a photographic relief of the present invention, a three-dimensional unadjusted sculpture is first produced by a method of producing a stereophotographic sculpture. Second, the angle at which the individuality of the model is best represented is determined based on the sculpture. Third, the unadjusted sculpture is photographed at that angle. Finally a relief is produced based on the pictures thus obtained. The model only needs to be photographed once. This produces no pain for the model and makes it possible to easily produce a relief of the model as viewed from the most preferable angle.

It is to be understood that the appended claims are intended to cover all of such generic and specific features particular to the invention as disclosed herein and all statements relating to the scope of the invention, which as a matter of language might be said to fall thereunder.

What is claimed is:

1. A method of producing a photographic relief comprising the steps of:

disposing a plurality of first cameras and a plurality of first projectors, each being loaded with a screen having a plurality of parallel lines therein, around an object to be photographed at a predetermined object distance to take a first photographic picture with each of said first cameras while projecting said screens from said first projectors onto said object to be photographed;

disposing a plurality of second projectors at a predetermined operative distance of projection from a mass of material to be modeled such that they may be located in a similar position to that of each of said first cameras, and each of said second projectors being loaded with each of said first pictures thereby projecting said first pictures onto said mass of material to be modeled which is then processed so that said parallel lines project from said first pictures on said mass of material to be modeled, said parallel lines overlapping with each other to produce an unadjusted sculpture similar to said photographed object;

placing said unadjusted sculpture on a base which can be tilted at a desired angle as a second object to take a second set of photographic pictures in a preferable attitude; and producing an unadjusted relief, using said second photographic pictures, and finishing said unadjusted relief to produce a relief.

2. A method of producing a photographic relief according to claim 1, wherein said steps of producing said relief further comprises the steps of:

disposing a third camera and a third projector loaded with a screen having a plurality of parallel lines in front of said unadjusted sculpture at an arbitrary distance and disposing a fourth camera in a position displaced at an arbitrary angle a from a line connecting a vertical axis of said unadjusted sculpture and said third camera; taking a third picture and a fourth picture of said unadjusted sculpture with said third and fourth cameras, respectively, while projecting said screen onto said unadjusted sculpture from said third projector;

disposing a fourth projector in the position of said fourth camera and a fifth camera in a position displaced at an arbitrary angle β from a line connecting the vertical axis of said unadjusted sculpture and said fourth camera;

projecting said fourth picture from said fourth projector onto a reference plane orthogonal to said line connecting the vertical axis of said unadjusted sculpture and said third camera and photographing the image projected on said reference plane with said fifth camera to obtain a fifth picture;

thereafter, disposing a fifth projector and a sixth projector in the positions of said third and fifth cameras, respectively, to project said third and fifth pictures onto said reference plane from said fifth and sixth projectors, respectively, and adding or removing clay so that the parallel lines projected from said third and fifth pictures intersect on the surface of a lump of clay.

3. A method of producing a photographic relief according to claim 1, wherein said base for placing said unadjusted sculpture comprises a table supported on a leg, which allows it to be tilted up and down and back and forth.

4. A method of producing a photographic relief comprising the steps of:

disposing a plurality of first cameras around an object to be photographed at a predetermined object distance;

disposing a plurality of first projectors, each being loaded with an image having a plurality of parallel lines therein, around said object to be photographed at a predetermined object distance;

taking a first photographic picture with each of said first cameras while projecting said screens from said first projectors onto said object to be photographed;

disposing a plurality of second projectors at a predetermined operative distance of projection from a mass of material to be modeled such that they may be located in a similar position to that of each of said first cameras;

loading each of said second projectors with one of said first pictures;

projecting said first pictures, with said second projectors onto said mass of material to be modeled to provide projected pictures on said mass of material;

processing said mass of material with said projected pictures so that said pictures provide overlapping parallel lines to produce an unadjusted sculpture similar to said photographed object;

placing said unadjusted sculpture on a base which can be tilted at a desired angle and tilting said base to a desired angel;

providing photographic pictures of said unadjusted sculpture in a preferable attitude;

removing said unadjusted sculpture and placing a reference plane with plastic material thereon at the location said unadjusted sculpture occupied;

projecting said additional pictures on said plastic material; and adding or removing material based on said projected pictures to form a relief with said plastic material on said reference plane.

5. A method of producing a photographic relief comprising the steps of:

disposing a plurality of first cameras around an object to be photographed at a predetermined object distance;

disposing a plurality of first projectors, each being loaded with an image having a plurality of parallel lines therein, around said object to be photographed at a predetermined object distance;

taking a first photographic picture with each of said first cameras while projecting said screens from said first projectors onto said object to be photographed;

disposing a plurality of second projectors at a predetermined operative distance of projection from a mass of material to be modeled such that they may be located in a similar position to that of each of said first cameras;

loading each of said second projectors with one of said first pictures;

projecting said first pictures, with said second projectors onto said mass of material to be modeled to provide projected pictures on said mass of material;

processing said mass of material with said projected pictures so that said pictures provide overlapping parallel lines to produce an unadjusted sculpture similar to said photographed object;

placing said unadjusted sculpture on a base which can be tilted at a desired angle and tilting said base to a desired angel;

disposing an additional camera at an additional camera location, in front of the unadjusted sculpture, at a predetermined unadjusted sculpture distance;

disposing a projector of parallel lines at said additional camera location;

disposing another camera at a first displaced location, said another camera being displaced from said additional camera location by an angle $\alpha$ from a line connecting a vertical axis of the unadjusted sculpture and said additional camera location;

photographing said unadjusted sculpture, on said base at said desired angle, with said additional camera, to provide a second picture, and photographing said unadjusted sculpture, on said base at said desired angle, with said displaced camera, to provide a third picture, while said projector at said additional camera location in front of the unadjusted sculpture projects said parallel lines on said unadjusted sculpture;

disposing still another camera at another displaced location, displaced from said displaced location by an angle $\beta$ from a line connecting a vertical axis of the unadjusted sculpture and said another camera;

disposing another projector at a location of said another camera;

photographing said unadjusted sculpture with said still another camera, to provide a forth picture, at said another displaced location while said another projector at said displaced location projects said third picture on said unadjusted sculpture;

removing said unadjusted sculpture and placing a reference plane with plastic material thereon at the location said unadjusted sculpture occupied;

thereafter, disposing a projector at said additional camera location to project said second picture onto said reference plane and disposing a projector at said another displaced location to project said forth picture onto said reference plane;

adding or removing plastic material so that the parallel lines projected from said second and forth pictures intersect on the surface of the plastic material.

* * * * *

UNITED STATES PATENT AND TRADEMARK OFFICE
CERTIFICATE OF CORRECTION

PATENT NO. : 5,768,643
DATED : July 30, 1998
INVENTOR(S) : MORIOKA

It is certified that error appears in the above-indentified patent and that said Letters Patent is hereby corrected as shown below:

On the title page,

[30]  Foreign Application Priority Data

November 10, 1995    [JP]    Japan .................... 7-292338

Signed and Sealed this

Twenty-ninth Day of September, 1998

Attest:

BRUCE LEHMAN

*Attesting Officer*   Commissioner of Patents and Trademarks

UNITED STATES PATENT AND TRADEMARK OFFICE
CERTIFICATE OF CORRECTION

PATENT NO. : 5,768,643
DATED : June 16, 1998
INVENTOR(S) : MORIOKA

It is certified that error appears in the above-indentified patent and that said Letters Patent is hereby corrected as shown below:

On the title page, item:

[30] Foreign Application Priority Data

November 10, 1995 [JP] Japan................... 7-292338

This certificate supersedes Certificate of Correction issued September 29, 1998.

Signed and Sealed this

Twenty-sixth Day of January, 1999

Attest:

Attesting Officer

*Acting Commissioner of Patents and Trademarks*